(12) United States Patent
Chow et al.

(10) Patent No.: US 9,111,943 B2
(45) Date of Patent: Aug. 18, 2015

(54) ALIGNMENT STRUCTURES FOR INTEGRATED-CIRCUIT PACKAGING

(75) Inventors: Eugene M. Chow, Fremont, CA (US); Philipp H. Schmaelzle, Los Altos, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 679 days.

(21) Appl. No.: 12/725,754

(22) Filed: Mar. 17, 2010

(65) Prior Publication Data

US 2011/0227200 A1  Sep. 22, 2011

(51) Int. Cl.
| | |
|---|---|
| *H01L 23/48* | (2006.01) |
| *H01L 23/52* | (2006.01) |
| *H01L 23/544* | (2006.01) |
| *H01L 23/00* | (2006.01) |
| *H01L 25/065* | (2006.01) |
| *H01L 25/00* | (2006.01) |

(52) U.S. Cl.
CPC .............. *H01L 23/544* (2013.01); *H01L 24/13* (2013.01); *H01L 24/16* (2013.01); *H01L 24/81* (2013.01); *H01L 25/0657* (2013.01); *H01L 25/50* (2013.01); *H01L 2223/54426* (2013.01); *H01L 2223/54473* (2013.01); *H01L 2224/11013* (2013.01); *H01L 2224/11015* (2013.01); *H01L 2224/11848* (2013.01); *H01L 2224/1301* (2013.01); *H01L 2224/1319* (2013.01); *H01L 2224/13021* (2013.01); *H01L 2224/13023* (2013.01); *H01L 2224/13078* (2013.01); *H01L 2224/14179* (2013.01); *H01L 2224/1601* (2013.01); *H01L 2224/16145* (2013.01); *H01L 2224/16147* (2013.01); *H01L 2224/8112* (2013.01); *H01L 2224/81191* (2013.01); *H01L 2224/81193* (2013.01); *H01L 2224/81897* (2013.01); *H01L 2224/81948* (2013.01); *H01L 2225/06513* (2013.01); *H01L 2225/06531* (2013.01); *H01L 2225/06565* (2013.01); *H01L 2225/06593* (2013.01); *H01L 2924/014* (2013.01); *H01L 2924/01006* (2013.01); *H01L 2924/01033* (2013.01); *H01L 2924/01075* (2013.01); *H01L 2924/10253* (2013.01)

(58) Field of Classification Search
CPC ......... H01L 24/13; H01L 24/14; H01L 24/16; H01L 24/81; H01L 2223/54426; H01L 2224/81193; H01L 2924/15311
USPC ........................... 257/737, 690, 785, E23.021
See application file for complete search history.

(56) References Cited

U.S. PATENT DOCUMENTS

| | | | | |
|---|---|---|---|---|
| 5,329,423 | A | * | 7/1994 | Scholz ........................ 361/760 |
| 5,530,375 | A | * | 6/1996 | Seidel ...................... 324/750.05 |
| 5,786,979 | A | * | 7/1998 | Douglass ..................... 361/328 |
| 6,016,060 | A | * | 1/2000 | Akram et al. ............. 324/754.08 |
| 2010/0164097 | A1 | * | 7/2010 | Pendse .......................... 257/737 |

* cited by examiner

*Primary Examiner* — Nitin Parekh
(74) *Attorney, Agent, or Firm* — Park, Vaughan, Fleming & Dowler LLP; Steven E. Stupp

(57) ABSTRACT

A multi-chip module (MCM) that includes alignment features is described. This MCM includes at least two substrates having facing surfaces with positive features disposed on them. Note that a given positive feature on either of the surfaces protrudes above the surface. Furthermore, the two substrates are mechanically coupled by these positive features. In particular, a given one of the positive features on one of the surfaces mates with a given subset of the positive features on the other of the surfaces. Additionally, the given subset of the positive features includes two or more of the positive features.

19 Claims, 12 Drawing Sheets

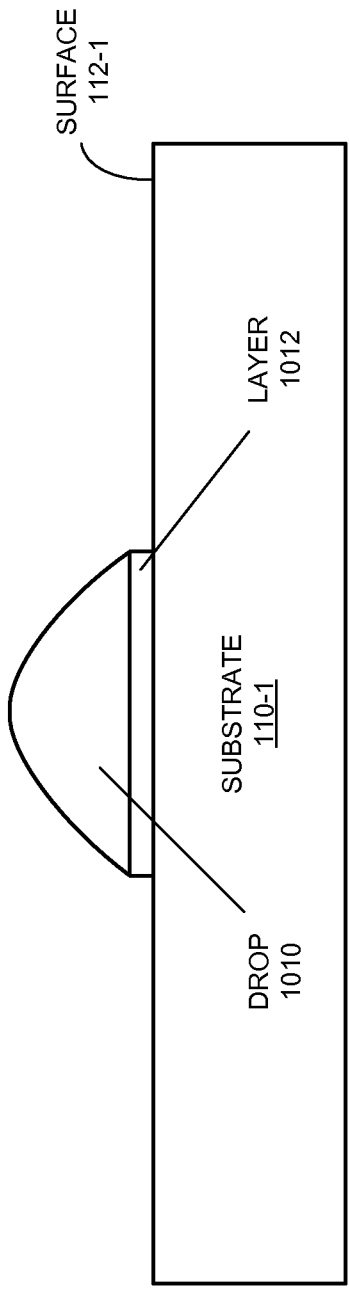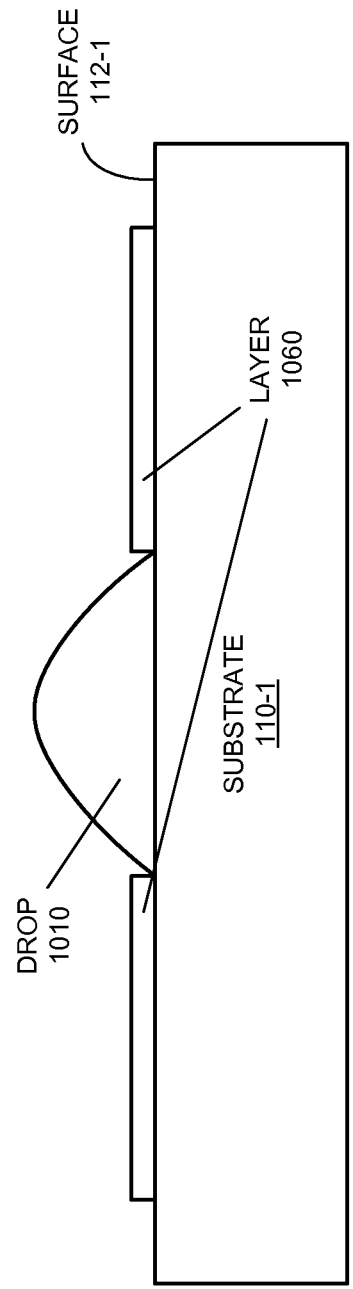

ALIGNMENT STRUCTURES FOR INTEGRATED-CIRCUIT PACKAGING

BACKGROUND

1. Field

The present disclosure generally relates to alignment structures for integrated-circuit packaging. More specifically, the present disclosure relates to alignment structures for use in a multi-chip module (MCM) and techniques for fabricating the MCM.

2. Related Art

Multi-chip modules (MCMs) are being developed to facilitate proximity communication (such as capacitively coupled communication) between multiple integrated circuits (ICs) for the next generation of high-performance computers. In these MCMs, adjacent chips are often positioned face-to-face so that information can be communicated between proximity connectors (such as metal pads) on the surfaces of the facing chips.

In order to enable ultrafast chip-to-chip communication speeds via capacitive coupling between the metal pads on the facing chips, these chips need to be aligned with each other on a micrometer scale. In some proposed MCMs, the alignment is obtained by using micro-spheres or balls that mate with pairs of opposing etch pits on the surfaces of facing silicon chips. However, this ball-and-pit alignment technique can be expensive because of: the cost of silicon substrates; and the active regions on the silicon substrates that are occupied by the etch pits. For example, the gap between adjacent chips for proximity communication is typically around 10 μm, while the ball-and-pit alignment technique may consume around 200×200 μm² of a silicon substrate when 200-μm diameter balls are used.

In addition, it can be difficult and expensive to assemble the MCMs because of: the difficulty of positioning the balls in the etch pits (which becomes more difficult as the size of the balls is reduced); the fact that the three components (two silicon substrates with etch pits and at least one ball) have additional degrees of freedom, which makes assembly more complicated; and the fact that the ball-and-pit alignment technique typically is not compatible with other, lower-cost substrates (such as organic or ceramic substrates). As a consequence, the costs of MCMs that use ball-and-pit alignment can be prohibitive.

Hence, what is needed is an MCM and an associated fabrication technique which do not suffer from the above-described problems.

SUMMARY

One embodiment of the present disclosure provides a multi-chip module (MCM) that includes a first substrate having a first surface, and a second substrate having a second surface that faces the first surface. Moreover, the first substrate includes first positive features disposed on the first surface, where a given first positive feature protrudes above the first surface. Furthermore, the second substrate includes second positive features disposed on the second surface, where a given second positive feature protrudes above the second surface. Note that the given second positive feature mates with a given subset of the first positive features, which includes two or more of the first positive features, thereby mechanically coupling the first substrate and the second substrate.

In some embodiments, the given subset of the first positive features includes three of the first positive features. Moreover, the first positive features may have: a trapezoidal shape, a top-hat shape, a pyramidal shape and/or a hemispherical shape. Similarly, the second positive features may have: a trapezoidal shape, a top-hat shape, a pyramidal shape and/or a hemispherical shape.

Additionally, a shape of a given positive feature, which can include the given first positive feature or the given second positive feature, may be defined, at least in part, by surface tension. For example, the shape of the given positive feature may be defined by reflowing a material in the given positive feature.

Note that the given positive feature may include: a dielectric, organic siloxane, inorganic siloxane and/or a polymer. Moreover, the given positive feature may be fabricated using an additive process.

Furthermore, the given positive feature may initially have an elastic modulus less than a predetermined value during a fabrication process, which facilitates assembly of the MCM. After the fabrication process, the elastic modulus may be greater than the predetermined value. For example, the elastic modulus may be increased from the initial value using thermal or optical curing. Alternatively or additionally, a shape of the given positive feature may have reduced symmetry that facilitates volume movement of the given positive feature in one or more directions during the fabrication process. This reduced symmetry may be associated with an asymmetric shape of the given positive feature.

Note that an elastic modulus of the given positive feature may be reduced temporarily during a fabrication process by imparting energy to the given positive feature, thereby facilitating assembly of the MCM.

In some embodiments, a given substrate, which can include the first substrate or the second substrate, includes a material other than a semiconductor. For example, the given substrate may include a ceramic or an organic material.

Moreover, in some embodiments the first substrate includes third positive features disposed on the first surface, where a given third positive feature protrudes above the first surface. Additionally, the second substrate may include fourth positive features disposed on the second surface, where a given fourth positive feature protrudes above the second surface. Note that the given third positive feature mates with a given subset of the fourth positive features, which includes two or more of the fourth positive features, thereby mechanically coupling the first substrate and the second substrate.

Furthermore, in some embodiments, the first substrate includes the second positive features disposed on the first surface, and the second substrate includes the first positive features disposed on the second surface. Note that a spatial arrangement of the first positive features and the second positive features disposed on the first surface may have mirror symmetry with a spatial arrangement of the first positive features and the second positive features disposed on the second surface.

Another embodiment provides an electronic device that includes the MCM.

Another embodiment provides a method for fabricating an MCM. During this method, first positive features are defined on the first surface of the first substrate, where the given first positive feature protrudes above the first surface. Moreover, second positive features are defined on the second surface of the second substrate, where the given second positive feature protrudes above the second surface. Then, the first substrate is mechanically coupled to the second substrate in the MCM by positioning the first substrate and the second substrate so that the first surface faces the second surface, and the given second positive feature mates with the given subset of the first positive features, which includes two or more of the first positive features.

BRIEF DESCRIPTION OF THE FIGURES

FIG. 10A is a block diagram illustrating fabrication of a positive feature in accordance with an embodiment of the present disclosure.

FIG. 10B is a block diagram illustrating fabrication of a positive feature in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

Embodiments of a multi-chip module (MCM) that includes alignment features, and a technique for fabricating the MCM are described. This MCM includes at least two substrates having facing surfaces with positive features disposed on them. Note that a given positive feature on either of the surfaces protrudes above the surface. Furthermore, the two substrates are mechanically coupled by these positive features. In particular, a given one of the positive features on one of the surfaces mates with a given subset of the positive features on the other of the surfaces. Additionally, the given subset of the positive features includes two or more of the positive features.

These alignment features in the MCM may facilitate lower-cost assembly and improved alignment of components in the MCM. In particular, by using the positive features, problems associated with assembly and alignment in the MCM may be improved or solved. For example, by using two components there are fewer degrees of freedom and the assembly process may be less complicated. Consequently, the MCM may have lower cost and improved performance relative to other MCMs.

Figure 1:
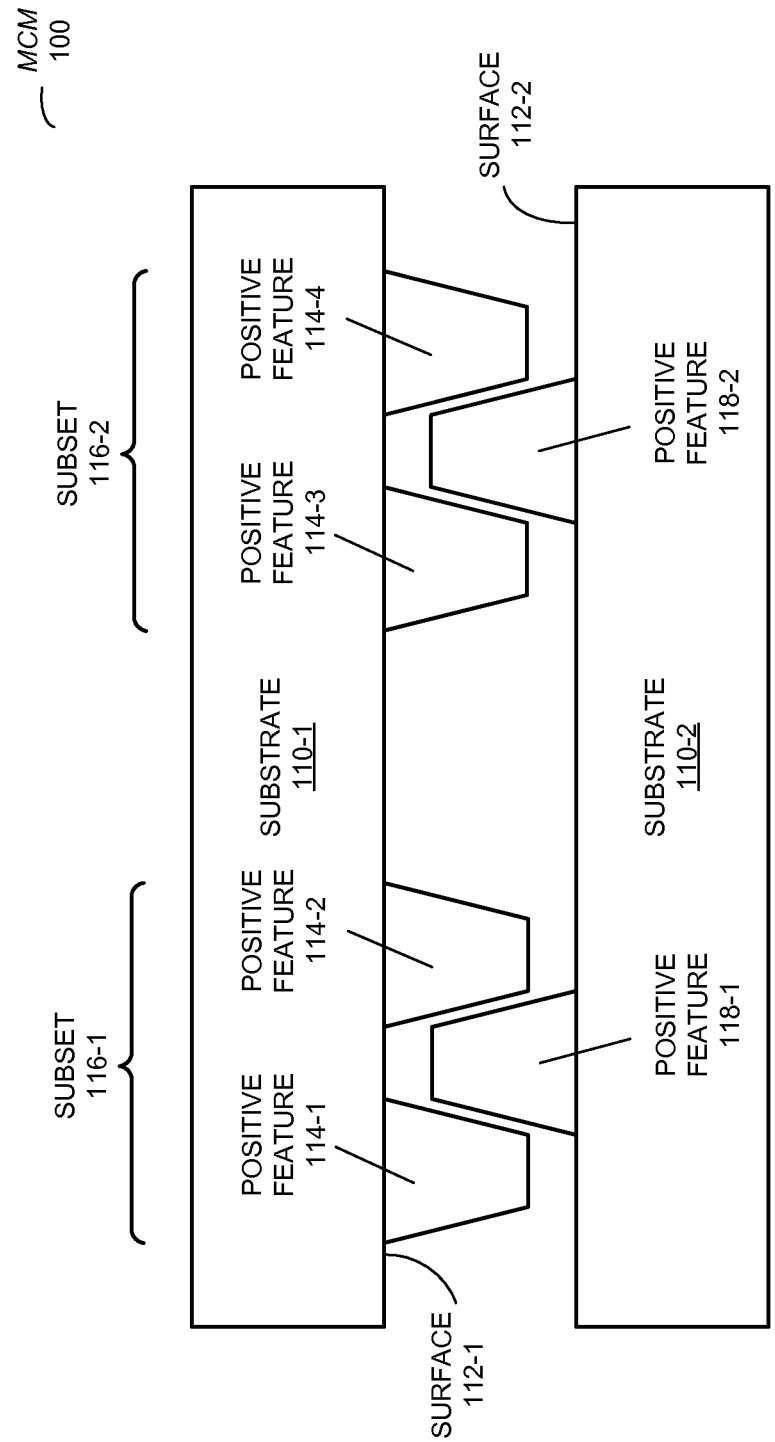
FIG. 1 is a block diagram illustrating a multi-chip module (MCM) with substrates that are mechanically coupled and aligned using positive features in accordance with an embodiment of the present disclosure.

We now describe embodiments of the MCM. FIG. 1 presents a block diagram illustrating a side view of an MCM 100. This MCM includes a substrate 110-1 having a surface 112-1, and a substrate 110-2 having a surface 112-2 that faces and at least partially overlaps surface 112-1. Moreover, to facilitate assembly and the precise alignment typically needed for proximity communication, overlapping, facing surfaces 112 may include alignment features. In particular, positive features 114 (such as trapezoidal-shaped posts) are disposed on surface 112-1, and positive features 118 are disposed on surface 112-2. Note that substrates 110 are vertically offset for clarity in FIG. 1 (as well as in the other embodiments of the MCM described below), and that a given one of these positive features (such as positive feature 114-1 or positive feature 118-1) protrudes above surface 112-1 or surface 112-2. Moreover, positive feature 118-1 mates and/or interlocks with a given subset 116-1 of positive features 114, which includes two or more of positive features 114, thereby mechanically coupling and aligning substrate 110-1 and substrate 110-2.

Positive features 114 and 118 (such as dielectric, organic siloxane, inorganic siloxane, plastic, polymer and/or metal structures) may be compatible with high-volume manufacturing. In particular, positive features 114 and 118 may be fabricated on surfaces 112 using semiconductor-process techniques (such as photolithography or direct-write lithography), plating and/or inkjet-process techniques (for example, a given positive feature may be fabricated using an additive process). Moreover, these positive features may be fabricated on a wide variety of substrates, including: a semiconductor (such as silicon), as well as non-semiconductor substrates (such as an organic substrate, a glass substrate, a plastic substrate, a ceramic substrate, or a printed circuit board).

These characteristics of MCM 100: may facilitate assembly without pick-and-place equipment; may obviate the need for an external locking mechanism or an adhesive (such as glue) to maintain the relative positions of the components in MCM 100 (thus allowing MCM 100 to be re-worked); and/or may not consume valuable substrate area for positive features 114 and 118 (for example, these positive features may be placed over circuits on substrates 110). Collectively, these characteristics may reduce the cost of MCM 100.

Figure 2:
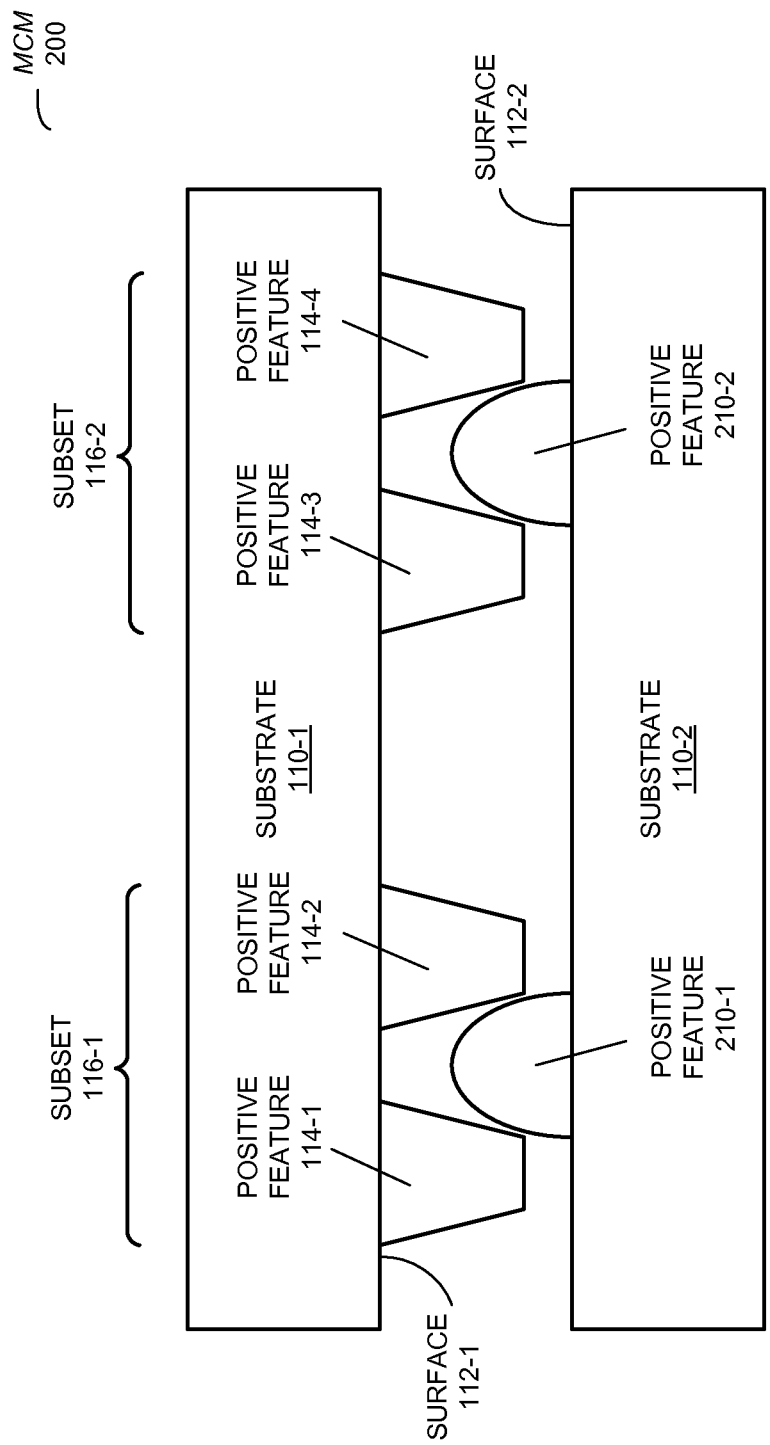
FIG. 2 is a block diagram illustrating an MCM with substrates that are mechanically coupled and aligned using positive features in accordance with an embodiment of the present disclosure.
Figure 3:
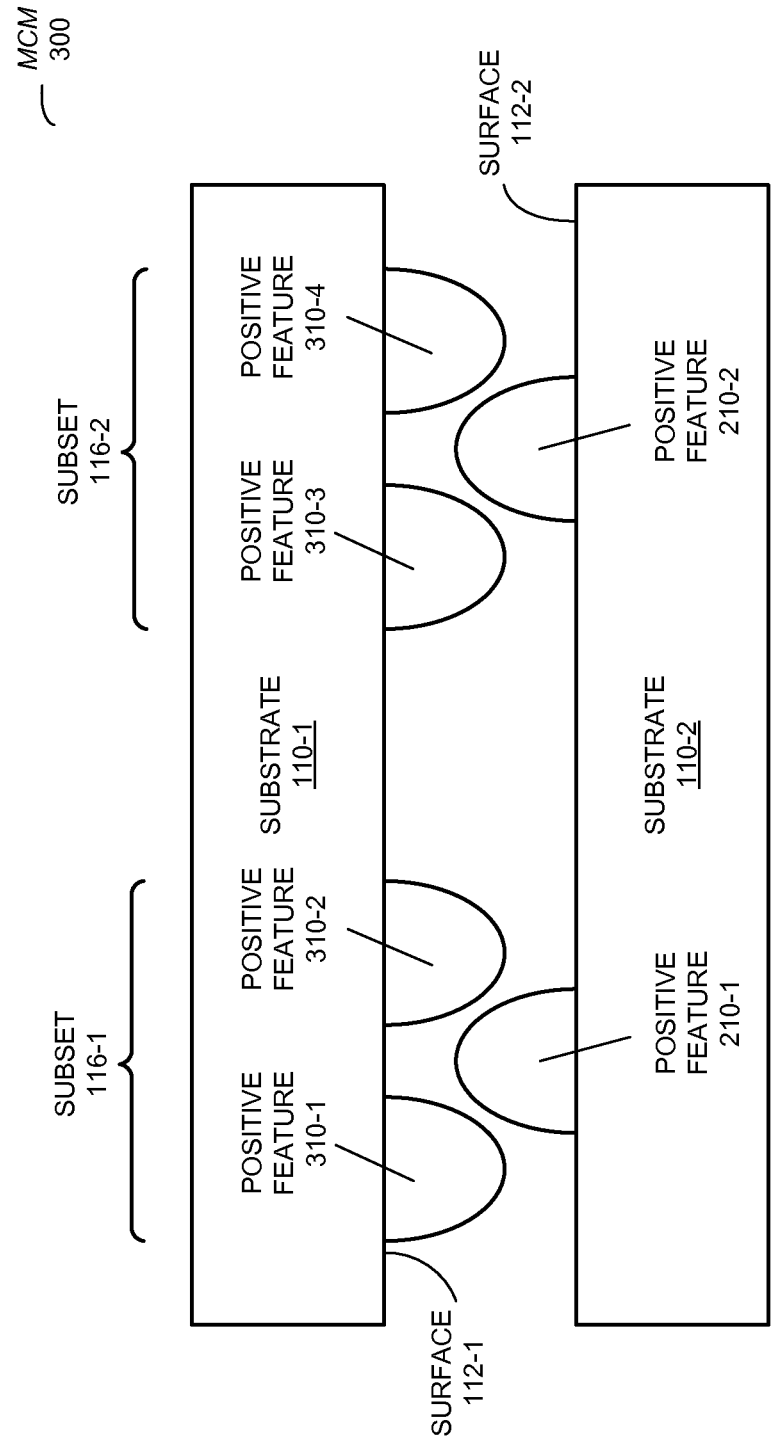
FIG. 3 is a block diagram illustrating an MCM with substrates that are mechanically coupled and aligned using positive features in accordance with an embodiment of the present disclosure.

As illustrated in FIG. 1, positive features 114 and 118 may have trapezoidal shapes. However, in other embodiments either or both of positive features 114 and 118 may include: micro-spheres (such as half-hemispheres), hooks, a keystone-shaped post, a top-hat-shaped post, a pyramidal shape, a cross-sectional slice through a cylinder, a cross-sectional slice through a torus (which provide an annular-shaped ring), pairs of counterposed micro-springs on facing surfaces 112, etc. More generally, a given positive feature may protrude above a surrounding surface. For example, FIG. 2 presents a block diagram illustrating a side view of an MCM 200 in which surface 112-2 includes positive features 210 (which have hemispherical shapes) and surface 112-1 includes positive features 114. (Note that a 'hemispherical shape' may include a shape in which a substantial portion of the positive feature's surface approximates the geometry of a minimal surface in response to a physical effect that is pronounced at micro-length scales, such as surface tension, thereby resulting in a geometry such as a spherical cap, etc.) Alternatively, FIG. 3 presents a block diagram illustrating a side view of an MCM 300 in which surface 112-1 may include positive features 310 and surface 112-2 may include positive features 210, all of which have hemispherical shapes.

Figure 4:
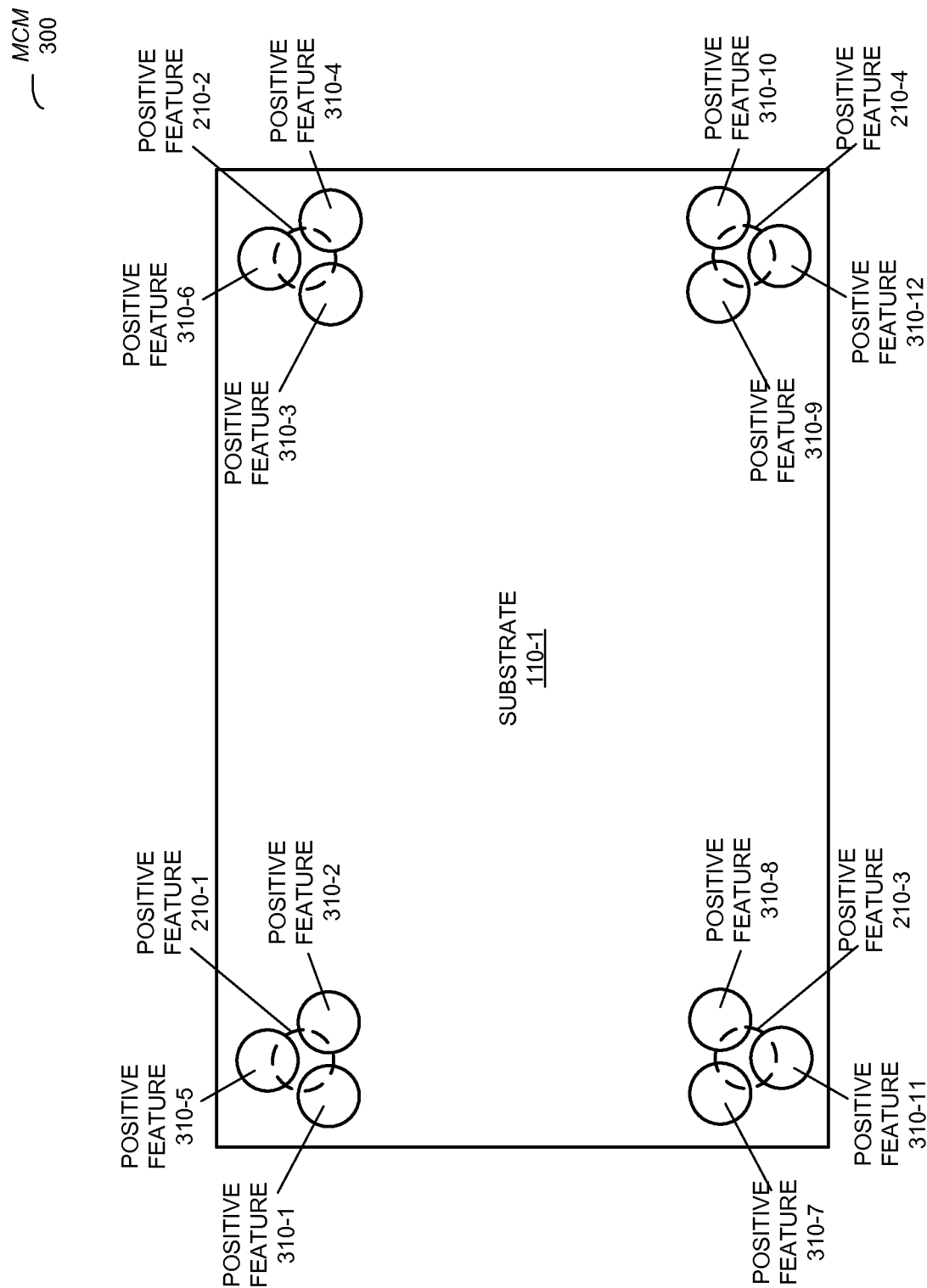
FIG. 4 is a block diagram illustrating an MCM with substrates that are mechanically coupled and aligned using positive features in accordance with an embodiment of the present disclosure.

In some embodiments, the given subset 116-1 of positive features includes three of positive features 310. This is shown in FIG. 4, which presents a block diagram illustrating a top view of a cross-section through positive features 210 and 310 in MCM 300.

Figure 5:
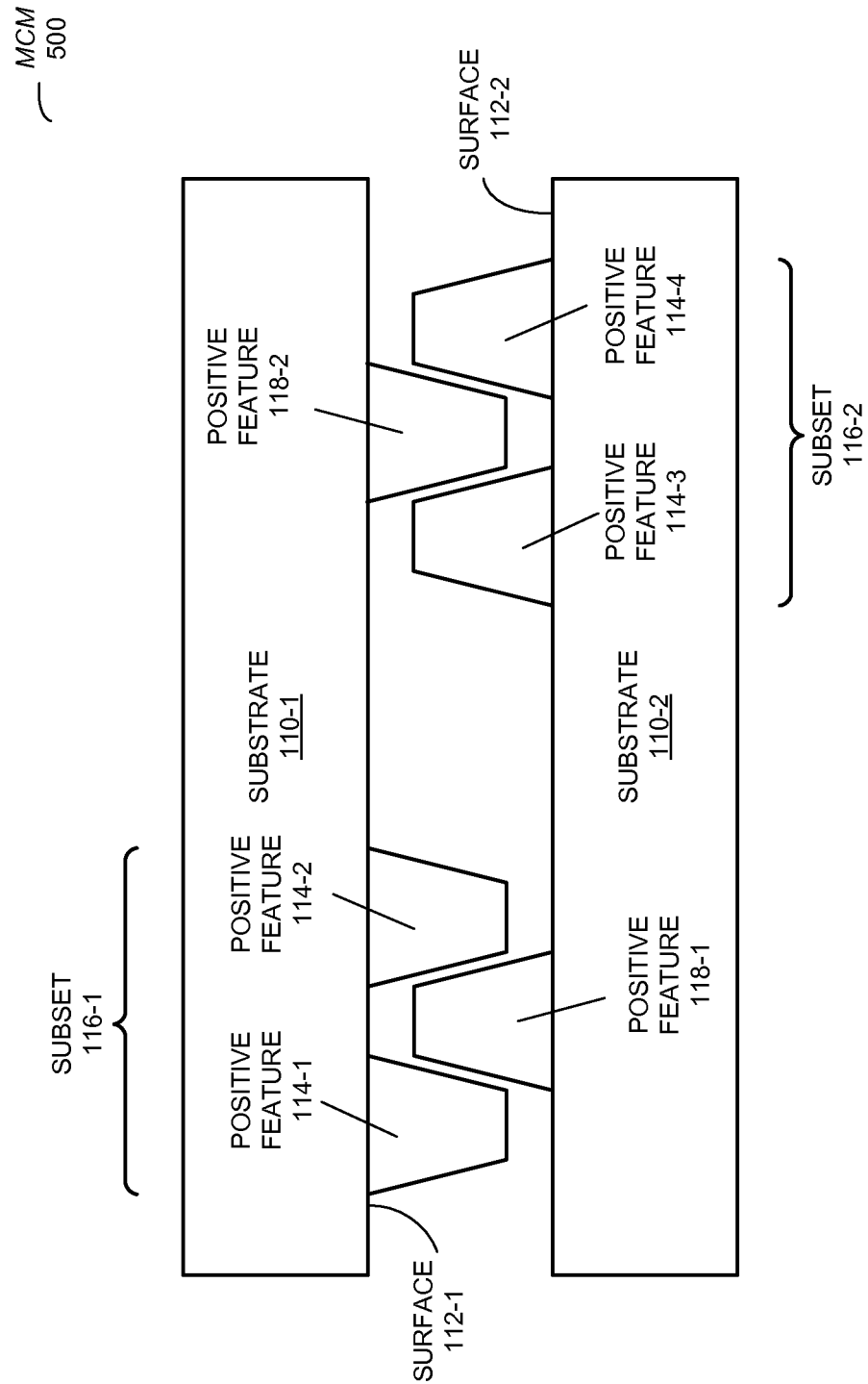
FIG. 5 is a block diagram illustrating an MCM with substrates that are mechanically coupled and aligned using positive features in accordance with an embodiment of the present disclosure.

Furthermore, in some embodiments positive features 114 are included on both surfaces 112, and positive features 118 are included on both surfaces 112 in mirror-image configuration so that positive features 114 on a given surface mate and/or interlock with positive features 118 on the other surface. This is shown in FIG. 5, which presents a block diagram illustrating an MCM 500.

Figure 6:
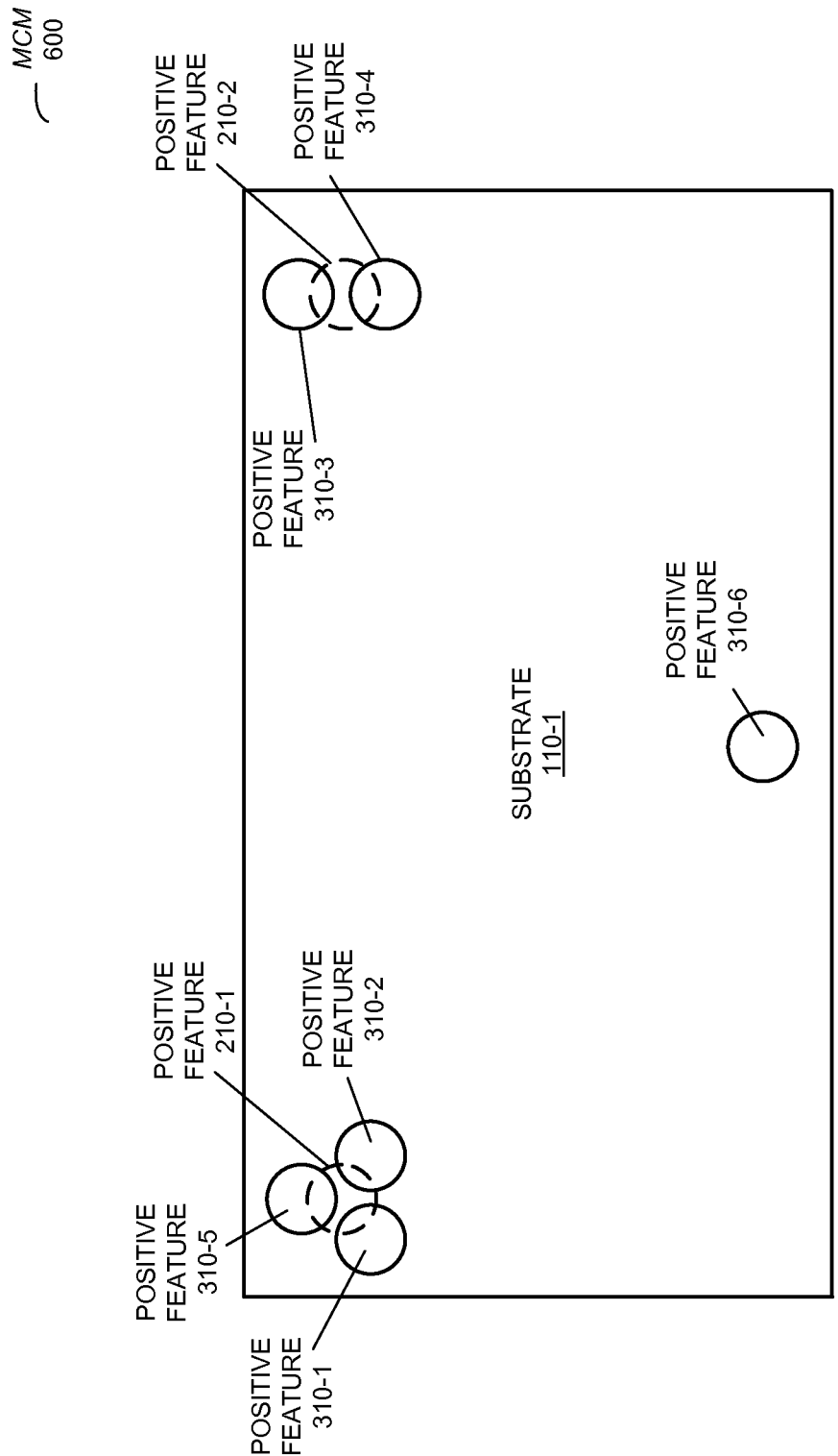
FIG. 6 is a block diagram illustrating an MCM with substrates that are mechanically coupled and aligned using positive features in accordance with an embodiment of the present disclosure.

Additionally, as shown in FIG. 6, which presents a block diagram illustrating an MCM 600, positive features 310 may have different sizes and may be arranged in different subsets, thereby allowing the six mechanical degrees of freedom to be uniquely specified (i.e., the problem is not overdefined). For example, a first subset may include three of positive features 310 (which specify x, y and z when they mate with corresponding positive feature 210-1), a second subset may include two of positive features 310 (which specify a first out-of-plane rotation angle and in-plane rotation angle when they mate with corresponding positive feature 210-2), and a third subset may include positive feature 310-6 (which specifies a second out-of-plane rotation angle when it mates with a corresponding positive feature, which is not shown). Moreover, positive feature 310-6 may have a higher height than positive features 310-1 through 310-5. (Note that in some embodiments positive feature 310-6 may not 'mate' with one or more additional positive features on the second substrate. Instead, it may simply mechanically contact a locally flat surface of the second substrate.) Thus, this configuration may allow the six mechanical degrees of freedom to be specified in a single assembly operation.

Assembly of an MCM may be facilitated by positive features that are made out of a polymeric material that is, at least initially, compliant. While such positive features may have initial (albeit tolerable) drawbacks for local alignment precision, the additional degrees of freedom may be useful when multiple components in an MCM are assembled and aligned. In such a mechanically overdefined situation, the compliance may reduce or eliminate the small tolerances that would otherwise 'add up' over several components in the MCM. Consequently, one or more of the positive features in the preceding embodiments of the MCM may be, at least initially, partially deformable (i.e., the one or more positive features may initially have an elastic modulus less than a predetermined value during a fabrication process). These compliant positive features can reduce mechanical stress, may facilitate an adaptive alignment process, and therefore may improve the overall registration. A subsequent curing operation (such as optical or thermal curing) may be used to make compliant positive features more rigid (i.e., after the curing operation, the elastic modulus may be greater than the predetermined value). In general, after curing, the elastic modulus of the positive features may be between 1 and 17000 MPa.

Figure 7:
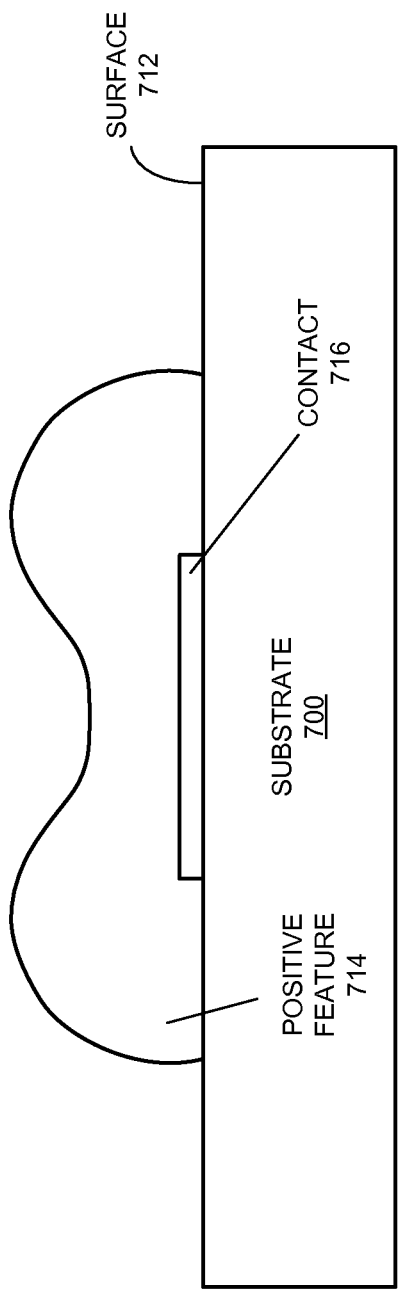
FIG. 7 is a block diagram illustrating a substrate and a positive feature in accordance with an embodiment of the present disclosure.

Alternatively or additionally, a shape of one of the at least initially compliant positive features may have reduced symmetry that facilitates volume movement of this positive feature in one or more directions during the fabrication process. This reduced symmetry may be associated with an asymmetric shape of the given positive feature. This is illustrated in FIG. 7, which presents a block diagram illustrating a substrate 700. In this substrate, positive feature 714 (which is disposed on surface 712) is initially compliant (depending on the composition, the Young's modulus of positive feature 714 may be varied by 6-7 orders of magnitude). It may be subsequently cured using light (for example, UV light), thermal energy and/or electrical current. The latter two options may be facilitated by contact 716.

In some embodiments, an elastic modulus of one or more of the positive features in the preceding embodiments of the MCM may be temporarily reduced during the fabrication process by imparting energy to this positive feature, thereby facilitating assembly of the MCM.

While the preceding embodiments illustrated the used of positive features, such as positive features 114 and 118 (FIG. 1), in other embodiments positive and/or negative features that mate and/or interlock with each other are used. For example, the negative alignment features may include pits, grooves, undercut ledges, etc. More generally, a given negative feature may be recessed below a surrounding surface, and may have an opening defined by an edge. Note that these negative features may be compatible with high-volume manufacturing. In particular, the negative features may be fabricated on the surfaces using semiconductor-process techniques, plating and/or inkjet-process techniques.

Figure 8:
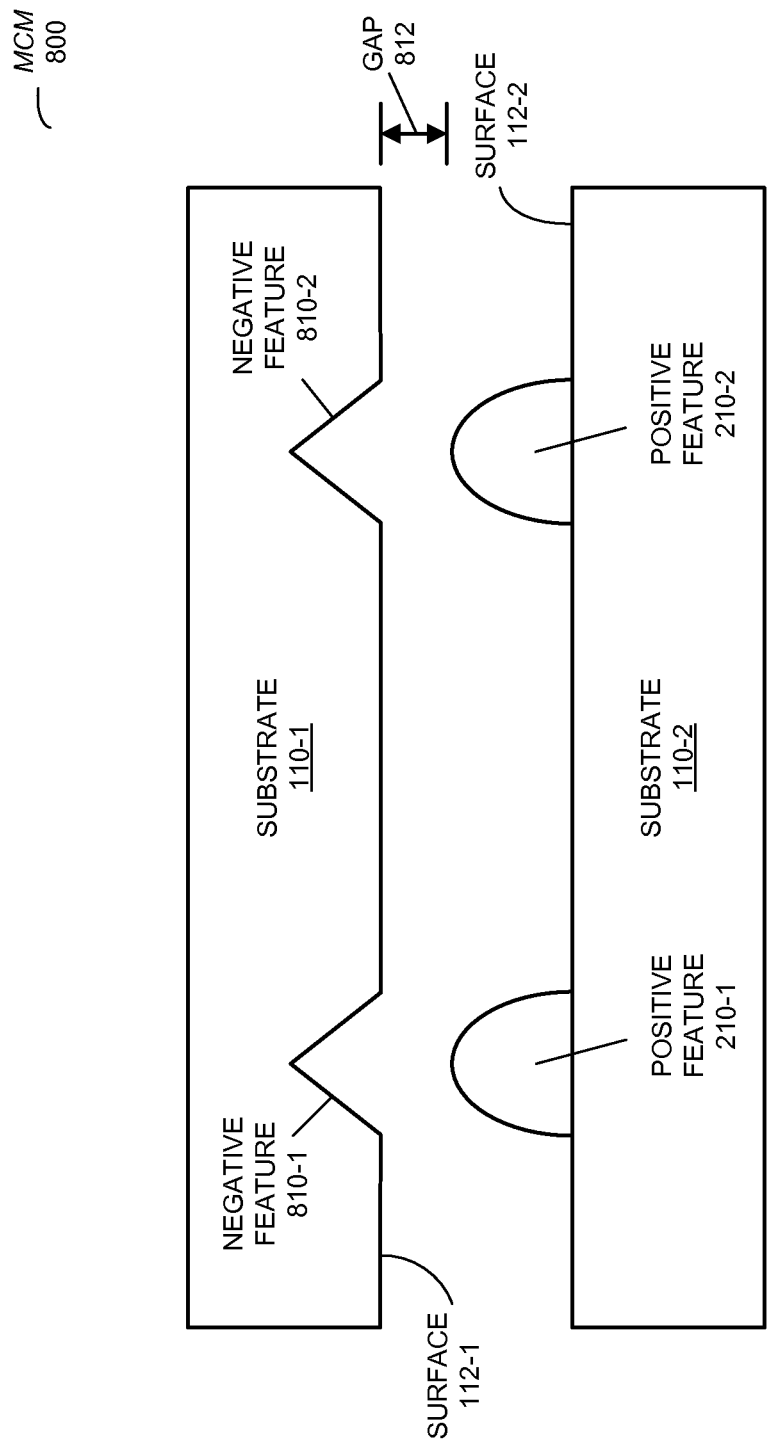
FIG. 8 is a block diagram illustrating an MCM with substrates that are mechanically coupled and aligned using positive and negative features in accordance with an embodiment of the present disclosure.
Figure 9:
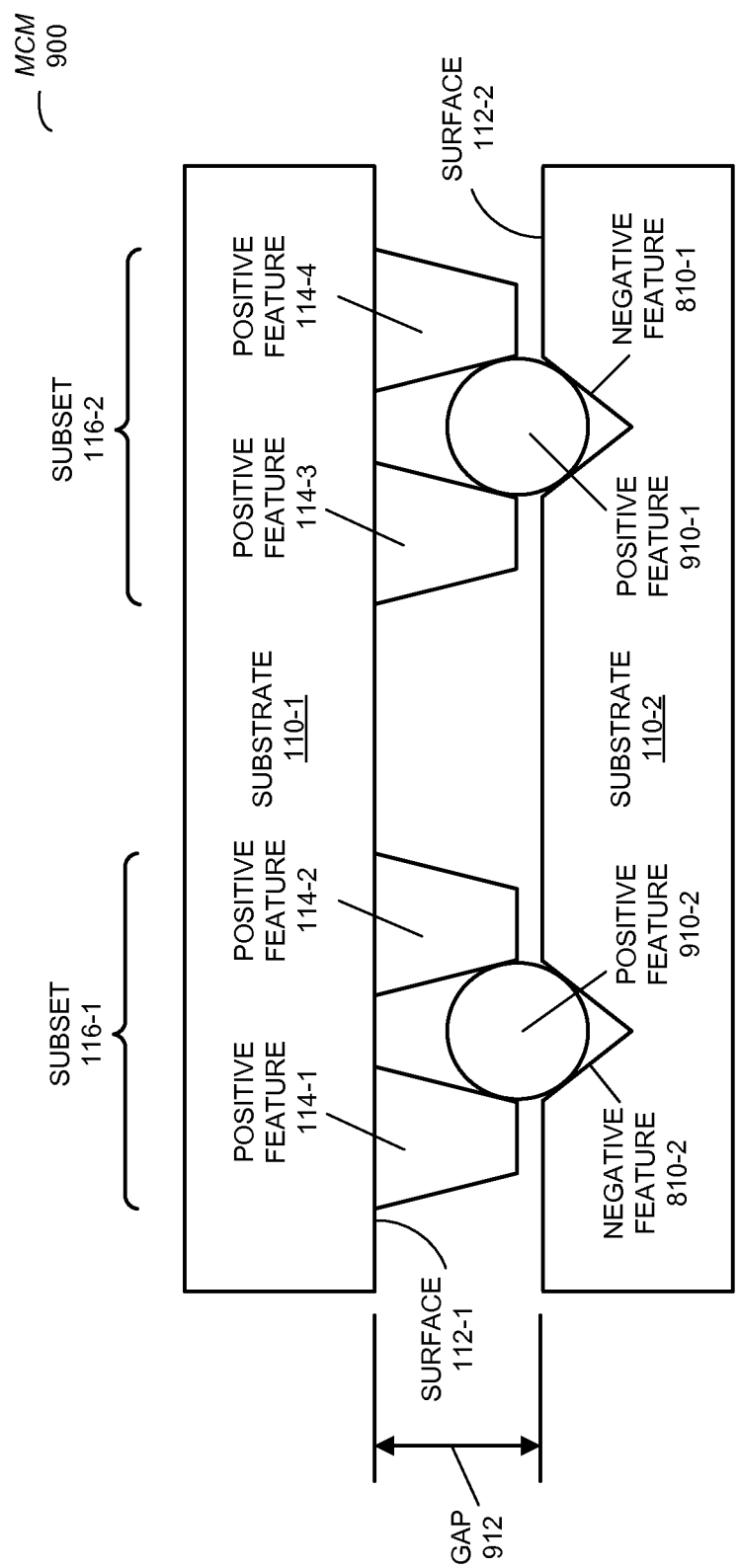
FIG. 9 is a block diagram illustrating an MCM with substrates that are mechanically coupled and aligned using positive and negative features in accordance with an embodiment of the present disclosure.

FIG. 8 presents a block diagram illustrating an MCM 800, which includes positive features 210 and corresponding negative features 810. This configuration may be used to mechanically couple a semiconductor die (such as substrate 110-1 in this example) to a ceramic or organic circuit board (such as substrate 110-2 in this example). Furthermore, electrical connections between substrates 110 in MCM 800 may include: proximity connectors, claw connectors, and/or conductive connectors. Therefore, in some embodiments, electrical connections between substrates 110 in MCM 800 may include solder balls (as opposed to electrical, magnetic or optical proximity connectors). Alternatively, FIG. 9 presents a block diagram illustrating an MCM 900. In this MCM, substrates 110 are mechanically coupled and aligned using negative features 810, positive features 910, and subsets 116 of positive features 114 (which each may include two or more of positive features 114).

Note that positive feature 910 may be a glass or sapphire balls, and negative features 810 may be fabricated using a wet chemical etch (such as TMAH) to create a precise crystal-plane-defined pit. Furthermore, in an exemplary embodiment, the positive features in FIGS. 8 and 9 have heights that are larger than gaps 812 (FIG. 8) and 912 in the z direction between surfaces 112 (when substrates 110 are not offset).

In order to increase the signal strength during proximity communication, small gaps (less than 20 µm) are usually preferred. With positive features fabricated using an additive process, this may limit the height of the positive feature to the size of the gap (such as gap 912). In some embodiments, positive features (such as posts) are fabricated using standard materials-deposition and patterning techniques, as known to one of skill in the art. For example, a positive feature that includes a photo-defined polymer may be fabricated using photo-lithography. Alternatively, for hemispheres (or, more generally, for an arbitrarily shaped positive feature), the positive features may be fabricated by reflowing posts or by using inkjet technology.

In the case of reflowing, a shape of a given positive feature, such as a positive feature on either or both of substrates 110 (FIG. 1), may be defined, at least in part, by surface tension. For example, an isolated fixed volume structure may be deposited, and subsequently reflowed.

As noted previously, in some embodiments alignment features, such as positive features, are fabricated using inkjet technology for 3-dimensional volume dispensing. Inkjet technology may allow precise geometric definition of the positive features, so that variations in the spacing between substrates (e.g., gap 912) are reduced. For example, using inkjet technology, hemispheres can be fabricated with less than 1 µm diameter variation. Moreover, a 2 pico-liter inkjet drop with a 20 µm diameter may be fabricated with a height of 10 µm.

FIG. 10A presents a block diagram illustrating fabrication of a positive feature using inkjet technology. In particular, a drop 1010 may be dispensed on a layer 1012 that has an attractive surface energy (e.g., hydrophilic), and then may be subsequently reflowed. Alternatively, as shown in FIG. 10B, which presents a block diagram illustrating fabrication of a positive feature, drop 1010 may be dispensed in a region defined by a layer 1060 that has a surface energy barrier (e.g., hydrophobic), and then may be subsequently reflowed.

In an exemplary embodiment, positive features are made from a liquid starting material (such as a curable inorganic-organic copolymer, such as a poly-siloxane, e.g., an ormocer). While the material is in the liquid state, surface tension is the dominant force on a small isolated volume of material and dictates the shape (topography) of this material volume. This shape is 'frozen in' upon curing (e.g., with UV), which may include factoring in a deterministic shrinkage. Note that the final positive features may derive their geometric precision from two parameters that are well controlled when the material is still in its liquid state: the definition of the 'footprint' (for example, using layer 1012 in FIG. 10A or layer 1060); and the definition of the volume.

In general, these two parameters may be controlled or adjusted in a variety of ways, including the footprint (the area where the positive feature contacts the substrate) and the volume of the positive feature (for example, using inkjet technology). The footprint may be defined using lithography to control the surface energy (hydrophilic versus hydrophobic, as shown in FIGS. 10A and 10B) and/or to control surface topography (such as pinning trenches or pedestals). Alternatively or additionally, inkjetting wetting materials and/or ablation (such as direct write) may be used. For example, a hydrophilic coat may be ablated onto a hydrophobic substrate (or vice versa). Similarly, the substrate material or an overcoat may be ablated to define a pinning topography (such as trenches or pedestals) that pin an inkjet drop (such as drop 1010).

Note that alignment features may be designed to promote thermal stability of the alignment in an MCM over a range of temperatures. For example, even though an inkjet material (such as ormocer) may have a coefficient of thermal expansion of around 100 ppm/C, this may be acceptable because the volume of the material in a given positive feature is small. Therefore, there may be a 0.1-1% change in the geometry of the given positive feature over a temperature variation of 100 C. This may correspond to a less than 1 µm change in the diameter of a hemisphere having a 50 µm diameter.

In general, in the present discussion an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, overlapping facing surfaces 112 (FIG. 1) of substrates 110 (FIG. 1) may include proximity connectors (not shown) that are configured to communicate signals via proximity communication. Proximity communication may include: communication of capacitively coupled signals ('electrical proximity communication' or 'capacitive proximity communication') and/or communication of optical signals (such as 'optical proximity communication'). In some embodiments, the electromagnetic proximity communication includes inductively coupled signals ('inductive proximity communication') and/or conductively coupled signals ('conductive proximity communication').

Figure 11:
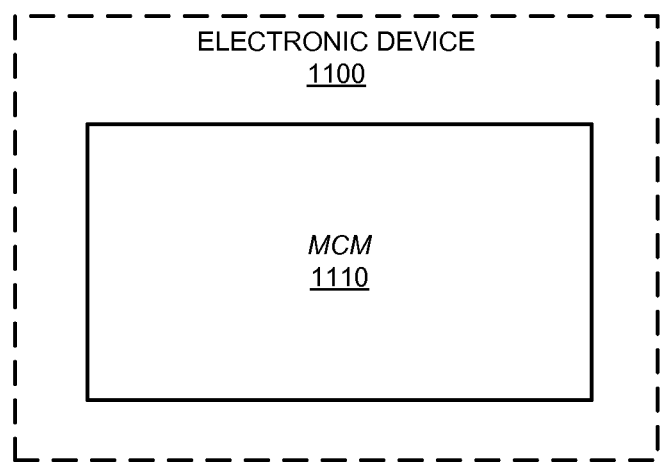
FIG. 11 is a block diagram of an electronic device that includes an MCM in accordance with an embodiment of the present disclosure.

One or more of the preceding embodiments of the MCM may be included in a system and/or an electronic device. This is shown in FIG. 11, which presents a block diagram of an electronic device 1100 that includes an MCM 1110, such as one of the MCMs in the preceding embodiments.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that electronic device 1100 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another, electronic computing device. Moreover, note that a given computer system may be at one location or may be distributed over multiple, geographically dispersed locations.

MCMs in FIGS. 1-6 and 8, substrate 700 (FIG. 7), the positive features in FIG. 10A and FIG. 10B, and/or electronic device 1100 may include fewer components or additional components. For example, positive features 114 and/or 118 in FIG. 1 may be disposed on surfaces 112 of substrates 110 or in layers that are deposited on surfaces 112. Similarly, negative features (such as negative features 810 in FIG. 8) may be recessed below a local surface, which may be surfaces 112 of substrates 110 or in layers that are deposited on surfaces 112. Thus, in the preceding embodiments, a surface of a substrate should be understood to include a surface of a layer deposited on the substrate or a surface of the substrate itself.

Furthermore, although these embodiments are illustrated as having a number of discrete items, these MCMs, positive features and electronic devices are intended to be functional descriptions of the various features that may be present rather than structural schematics of the embodiments described herein. Consequently, in these embodiments two or more components may be combined into a single component, and/or a position of one or more components may be changed.

Note that positive features and/or negative features may be defined using an additive process (i.e., a material-deposition process) and/or a subtractive process (i.e., a material-removal process). For example, the process may include: sputtering, plating, isotropic etching, anisotropic etching, a photolithographic technique, a direct-write technique and/or an inkjet technique. Additionally, these features may be fabricated using a wide variety of materials, including: a dielectric, organic siloxane, inorganic siloxane, a plastic, a polymer, a metal, glass, sapphire, silicon dioxide, and/or a semiconductor.

Furthermore, while the alignment features (including positive features and/or negative features) can be used to provide remateable mechanical coupling, in other embodiments the alignment features provide rigid mechanical coupling.

Figure 12:
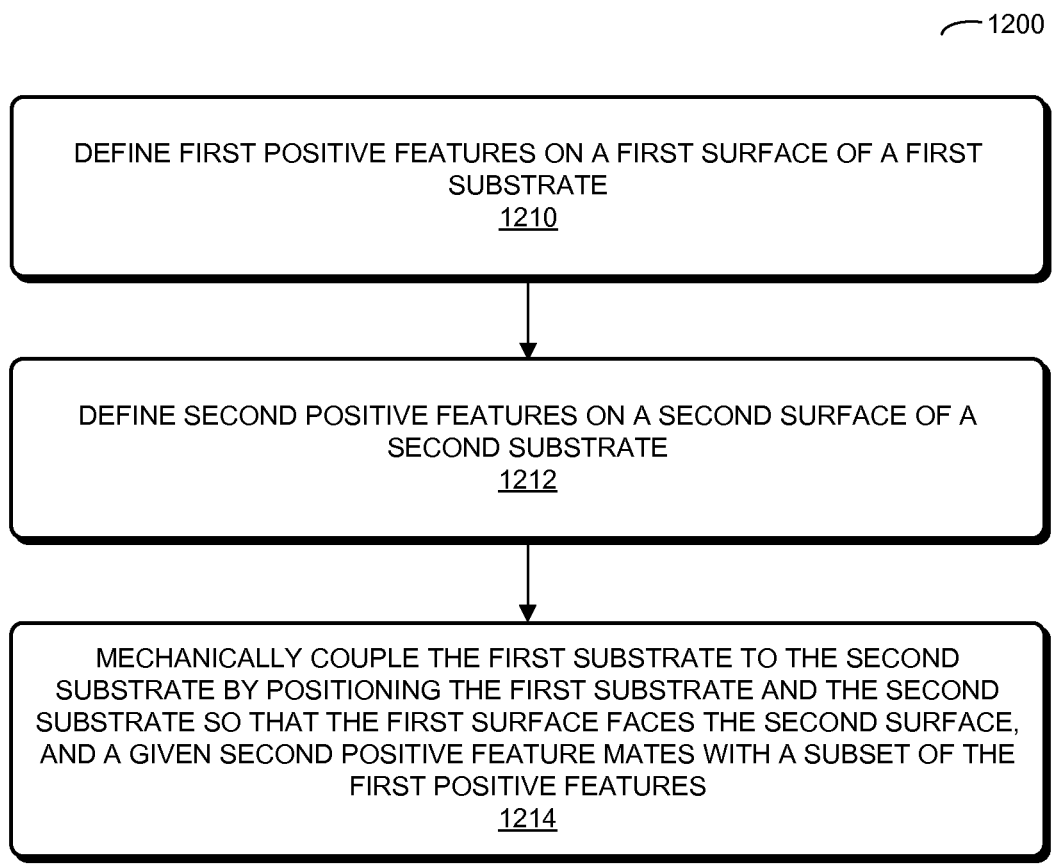
FIG. 12 is a flow chart illustrating a process for fabricating an MCM in accordance with an embodiment of the present disclosure.

We now describe embodiments of processes for fabricating an MCM. FIG. 12 presents a flow chart illustrating a process 1200 for fabricating an MCM, such as one of the MCMs in the preceding embodiments. During the process, first positive features are defined on the first surface of the first substrate (operation 1210), where the given first positive feature protrudes above the first surface. Moreover, second positive features are defined on the second surface of the second substrate (operation 1212), where the given second positive feature protrudes above the second surface. Then, the first substrate is mechanically coupled to the second substrate in the MCM (operation 1214) by positioning the first substrate and the second substrate so that the first surface faces the second surface, and the given second positive feature mates with the given subset of the first positive features, which includes two or more of the first positive features.

In some embodiments of process 1200, there are additional or fewer operations. Moreover, the order of the operations may be changed, and/or two or more operations may be combined into a single operation.

While the alignment features have been illustrated in embodiments of the MCM, the alignment features may be used in a variety of different applications to provide electrical and mechanical coupling to arbitrary components.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multi-chip module (MCM), comprising:
a first chip substrate having a first surface, wherein the first chip substrate includes a set of first positive features disposed on the first surface, and wherein a given first positive feature in the set of first positive features protrudes above the first surface; and
a second chip substrate having a second surface that faces the first surface, wherein the second chip substrate includes a set of second positive features disposed on the second surface, and wherein a gap between the first and the second chip substrate enables proximity communication within the MCM;
wherein a given second positive feature in the set of second positive features protrudes above the second surface; and
wherein the given second positive feature mates with a given subset of the set of first positive features, which includes two or more of the first positive features, thereby mechanically coupling the first chip substrate and the second chip substrate;
wherein the given second positive feature comprises a hemispherical shape and the two or more of the first positive features do not comprise a hemispherical shape, or the two or more of the first positive features comprise a hemispherical shape and the given second positive feature does not comprise a hemispherical shape; and
wherein all positive features in the set of first positive features are electrically disconnected from all circuits in the first chip substrate.

2. The MCM of claim 1, wherein the given subset of the set of first positive features includes three of the first positive features.

3. The MCM of claim 1, wherein the set of first positive features includes one or more of: a trapezoidal shape, a hook shape, a spring shape, a cylindrical shape, a toroidal shape, a top-hat shape, a keystone shape, a pyramidal shape, a spherical shape and a hemispherical shape.

4. The MCM of claim 1, wherein the set of second positive features includes one or more of: a trapezoidal shape, a hook shape, a spring shape, a cylindrical shape, a toroidal shape, a top-hat shape, a keystone shape, a pyramidal shape, a spherical shape and a hemispherical shape.

5. The MCM of claim 1, wherein a shape of a given positive feature, which can include one of the given first positive feature and the given second positive feature, is defined, at least in part, by surface tension.

6. The MCM of claim 5, wherein the shape of the given positive feature is defined by reflowing a material in the given positive feature.

7. The MCM of claim 1, wherein a given positive feature, which can include one of the given first positive feature and the given second positive feature, initially has an elastic modulus less than a predetermined value during a fabrication process, which facilitates assembly of the MCM; and
wherein, after the fabrication process, the elastic modulus is greater than the predetermined value.

8. The MCM of claim 7, wherein the elastic modulus is increased from the initial value using one or more of thermal curing and optical curing.

9. The MCM of claim 7, wherein a shape of the given positive feature has reduced symmetry that facilitates volume movement of the given positive feature in one or more directions during the fabrication process.

10. The MCM of claim 7, wherein the reduced symmetry is associated with an asymmetric shape of the given positive feature.

11. The MCM of claim 1, wherein an elastic modulus of a given positive feature, which can include one of the given first positive feature and the given second positive feature, is reduced temporarily during a fabrication process by imparting energy to the given positive feature, thereby facilitating assembly of the MCM.

12. The MCM of claim 1, wherein the first chip substrate includes a set of third positive features disposed on the first surface;

wherein a given third positive in the set of third positive features feature protrudes above the first surface;

wherein the second chip substrate includes a set of fourth positive features disposed on the second surface;

wherein a given fourth positive feature in the set of fourth positive features protrudes above the second surface; and wherein the given third positive feature mates with a given subset of the set of fourth positive features, which includes two or more of the fourth positive features, thereby mechanically coupling the first chip substrate and the second chip substrate.

13. The MCM of claim 1, wherein the first chip substrate includes a subset of the set of second positive features disposed on the first surface; and wherein the second chip substrate includes the a subset of the set of first positive features disposed on the second surface.

14. The MCM of claim 13, wherein a spatial arrangement of the first positive features and the second positive features disposed on the first surface has mirror symmetry with a spatial arrangement of the first positive features and the second positive features disposed on the second surface.

15. The MCM of claim 1, wherein the gap between the first and the second chip substrate is less than 20 μm.

16. The MCM of claim 1, wherein a given positive feature, which can include one of the given first positive feature and the given second positive feature, consists of one or more of an organic siloxane and an inorganic siloxane.

17. The MCM of claim 1, wherein a given positive feature, which can include one of the given first positive feature and the given second positive feature, consists of one or more of glass, sapphire, and plastic.

18. The MCM of claim 1, wherein a given positive feature, which can include one of the given first positive feature and the given second positive feature, consists of silicon dioxide.

19. An electronic device, comprising a MCM, wherein the MCM includes:

a first chip substrate having a first surface, wherein the first chip substrate includes a set of first positive features disposed on the first surface, and wherein a given first positive feature in the set of first positive features protrudes above the first surface; and a second chip substrate having a second surface that faces the first surface, wherein the second chip substrate includes a set of second positive features disposed on the second surface, and wherein the gap between the first and the second chip substrate enables proximity communication within the MCM;

wherein a given second positive feature in the set of second positive features protrudes above the second surface, wherein the given second positive feature mates with a given subset of the first positive features, which includes two or more of the first positive features, thereby mechanically coupling the first chip substrate and the second chip substrate, wherein the given second positive feature comprises a hemispherical shape and the two or more of the first positive features do not comprise a hemispherical shape, or the two or more of the first positive features comprise a hemispherical shape and the given second positive feature does not comprise a hemispherical shape; and wherein all positive features in the set of first positive features are electrically disconnected from all circuits in the first chip substrate.

\* \* \* \* \*

UNITED STATES PATENT AND TRADEMARK OFFICE
CERTIFICATE OF CORRECTION

PATENT NO. : 9,111,943 B2  
APPLICATION NO. : 12/725754  
DATED : August 18, 2015  
INVENTOR(S) : Eugene M. Chow et al.

Page 1 of 1

It is certified that error appears in the above-identified patent and that said Letters Patent is hereby corrected as shown below:

In the claims

In claim 10 (at column 10, line 56), please delete the words "claim 7" and replace with the words:

--claim 9--

Signed and Sealed this
Second Day of February, 2016

Michelle K. Lee
*Director of the United States Patent and Trademark Office*